United States Patent [19]

Takasuka et al.

[11] Patent Number: 4,882,682
[45] Date of Patent: Nov. 21, 1989

[54] APPARATUS FOR DETECTING POSITION OF INTERNAL FAULT OF GAS INSULATED BUS

[75] Inventors: Koji Takasuka; Koji Ibuki, both of Hyogo, Japan

[73] Assignee: Mitsubishi Denki Kabushiki Kaisha, Tokyo, Japan

[21] Appl. No.: 190,095

[22] Filed: May 4, 1988

Related U.S. Application Data

[63] Continuation of Ser. No. 793,065, Oct. 18, 1985, abandoned.

[30] Foreign Application Priority Data

Nov. 1, 1984 [JP] Japan .................. 59-230840

[51] Int. Cl.⁴ .................................. G01R 31/08
[52] U.S. Cl. ........................... 364/507; 364/481; 364/551.01; 324/536; 324/544; 324/522; 324/557; 324/455
[58] Field of Search .............. 364/507, 551.01, 480, 364/481; 324/512, 524, 536, 541, 544, 555, 557, 551, 444, 455, 522, 456, 530

[56] References Cited

U.S. PATENT DOCUMENTS

| | | | |
|---|---|---|---|
| 3,370,227 | 2/1968 | Bader et al. | 324/536 X |
| 3,421,076 | 1/1969 | Eigen | 324/536 X |
| 3,851,161 | 11/1974 | Sloop | 364/507 X |
| 3,869,665 | 3/1975 | Kenmochi et al. | 324/536 X |
| 3,931,502 | 1/1976 | Kohlos | 364/481 X |
| 3,985,024 | 10/1976 | Horak | 364/507 X |
| 4,249,126 | 2/1981 | McConnell | 324/52 |
| 4,446,420 | 5/1984 | Drouet | 324/52 |
| 4,535,321 | 8/1985 | Merz | 340/520 |
| 4,570,231 | 2/1986 | Bunch | 364/481 X |
| 4,586,142 | 4/1986 | Cota et al. | 364/507 |
| 4,618,933 | 10/1986 | Vitins | 324/515 X |

FOREIGN PATENT DOCUMENTS

0136661 8/1984 Japan .

Primary Examiner—Parshotam S. Lall
Assistant Examiner—Joseph L. Dixon
Attorney, Agent, or Firm—Lowe, Price, LeBlanc, Becker & Shur

[57] ABSTRACT

An apparatus for detecting position of internal fault in a gas-insulated bus bar (1) comprises electrodes (30) each of which are provided in section of predetermined length along axial direction of the tubular-shaped housing and the electrodes (30) can detect changes of voltage of a conductor (3) in each section and thereby can detect a point of fault.

2 Claims, 6 Drawing Sheets

APPARATUS FOR DETECTING POSITION OF INTERNAL FAULT OF GAS INSULATED BUS

This application is a continuation of application Ser. No. 793,065, filed Oct. 18, 1985, now abandoned.

FIELD OF THE INVENTION AND RELATED ART STATEMENT

1. Field of the Invention

The present invention relates to apparatus for detecting position of internal fault in a gas insulated bus.

2. Description of the Related Art

FIG. 4 shows a schematic diagram of a typical gas insulated switch gear mounted with a conventional fault detecting device consists of a set of current transformers. When an internal fault takes place in a bus bar 1, a current transformer CT detects the unusual current and activates an overcurrent relay OC. The overcurrent relay OC triggers the tripping operation of all circuit breakers CB, CB, ... which interrupt the current from systems connected to wires 5 to 9. Therefore, the systems 5 to 9 and the bus bar 1 are protected from an over current.

The occurrence of an interval fault necessitates internal inspection and restoration work for operation thereafter. Referring to FIG. 1, the restoration work requires dismounting the bus bar unit which consists of a conductor 3 held in a tubular-shaped housing 2 and separated by space 4 which is filled with an insulating gas. Each tubular-shaped housing 2 is connected with neighboring tubular-shaped housing 2 with a flange 20 on each housing.

In the conventional fault detector, although the occurrence of the fault can be detected, the position of the fault is not identified. Since the tubular-shaped housing 2 must be demounted one by one until the point of the fault is found, the restoration work of the gas insulated switch gear is time consuming. This fault detection system is only meant for detecting the fault, and cannot raise a warning when a pre-breakdown phenomenon, such as corona discharge, takes place.

OBJECT AND SUMMARY OF THE INVENTION

A primary purpose of the present invention is to provide an apparatus for detecting the position of a fault in gas insulated bus bar.

Apparatus for detecting the position of the internal fault in accordance with the present invention comprises, electrodes, which are provided in a tubular-shaped housing of a gas insulated bus bar, spaced at arbitrary distances from neighboring electrodes along the axial direction, measuring instruments which measure voltages of the electrodes and a processing unit which identifies the position by comparing the outputs from the measuring instruments.

DESCRIPTION OF THE PREFERRED EMBODIMENTS

Figure 1:
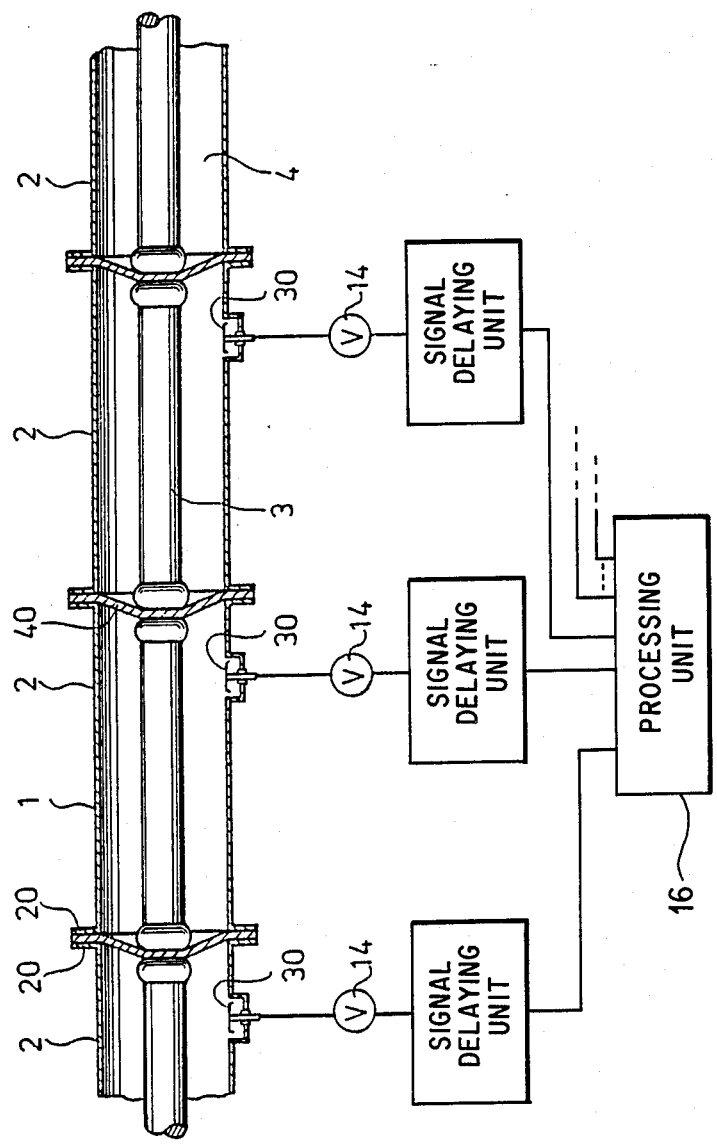
FIG. 1 is a cross-sectional view of a preferred embodiment of an apparatus for detecting the position of an internal fault in a gas insulated bus in accordance with the present invention.

A schematic illustration of an apparatus for detecting the position of an internal fault in a gas insulated bus in accordance with a present invention is presented in FIG. 1.

A bus bar 1 has a conductor 3 extending through a tubular-shaped housing 2 which is filled with insulating gas 4. Each tubular-shaped housing 2 is connected with neighboring tubular-shaped housing 2 by its flanges 20,20. The conductor 3 is held by insulating spacers 40 which divide the bus bar 1 into some gas sections. Electrodes 30 are provided in every gas section. FIG. 1 shows only a part of the bus bar 1, and omits other parts made similarly having the electrodes 30.

Figure 2:
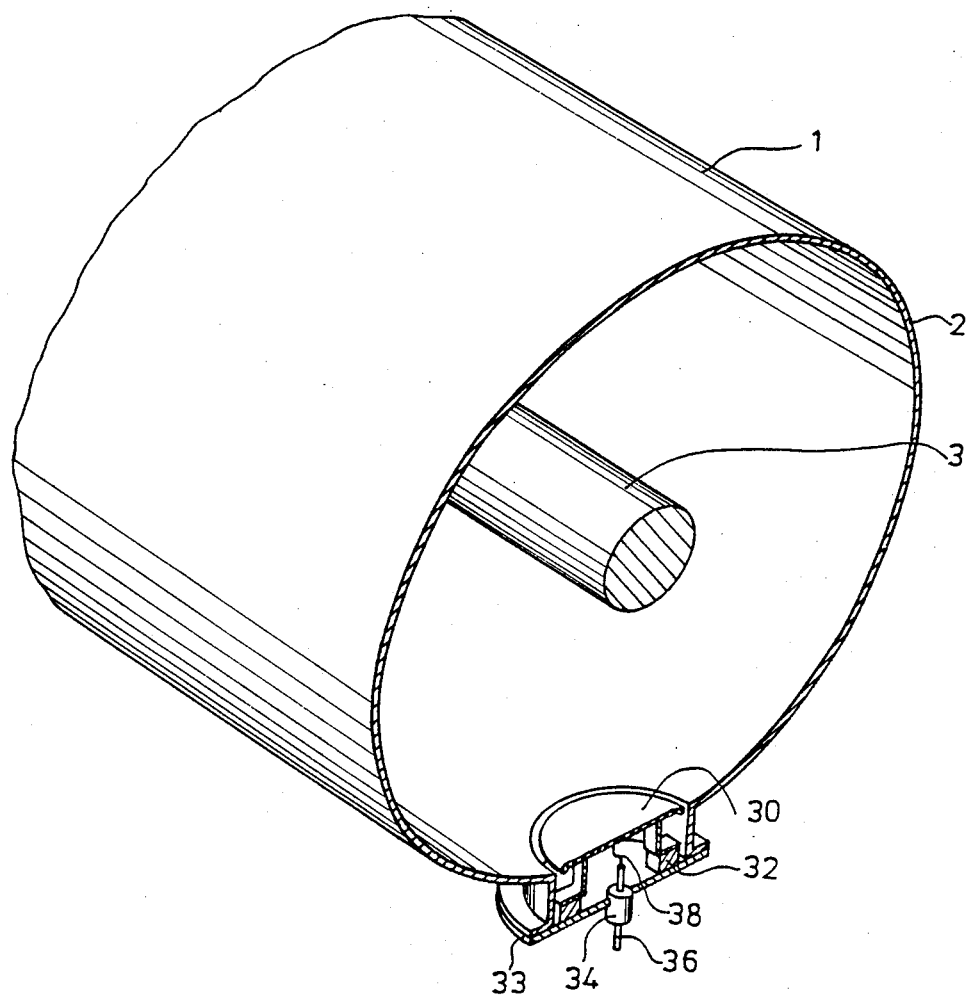
FIG. 2 is a fragmental perspective view showing an electrode shown in FIG. 1.

The electrode 30 is provided in each gas section and connected to a measuring instrument 14 for measuring voltage. Electrode 30 is formed discoid as shown in FIG. 2 and is supported by a supporting member 32 made of an insulating member. The electrode 30 is connected to a connecting wire 38 which is connected to a conductor 36, and is impressed with a voltage which is in proportion to a voltage of the conductor 3. An insulating gastight member 34 is provided around the conductor 36 for maintaining gastightness in the tubular-shaped housing 2.

Referring now to FIG. 1, the operation of the apparatus when a flashover takes place in the bus bar 1, is described as follows:

A flashover causes a zero voltage potential to appear on conductor 3 at the point of flashover. However, the entire length of conductor 3 does not experience a zero voltage potential at the same instant. Instead, conductor 3 is caused to experience a zero voltage potential from the point of the flashover and the zero voltage wave propagates from this portion in two directions. Electrodes 30, which are provided in each gas section with a predetermined radial gap against conductor 3, are impressed with voltages which are proportional to voltages of conductors 3 in respective sections. Therefore, measuring instruments 14 detect the transient voltages from the point adjacent to the flashover point distant points. Processing unit 16 receives the output data from measuring instruments 14 and, after processing the measured voltage signals, identifies the flashover point which corresponds to the point where the voltage transition occurs.

In a tubular-shaped housing when a corona discharge is generated in the bus bar 1, voltage oscillation of the conductor 3 is propagated from a corona point where the corona discharge takes place. Therefore the processing unit 16 can also indicate the corona point, because the voltage oscillation of the conductor 3 propagates from the point near the corona point.

Figure 3A:
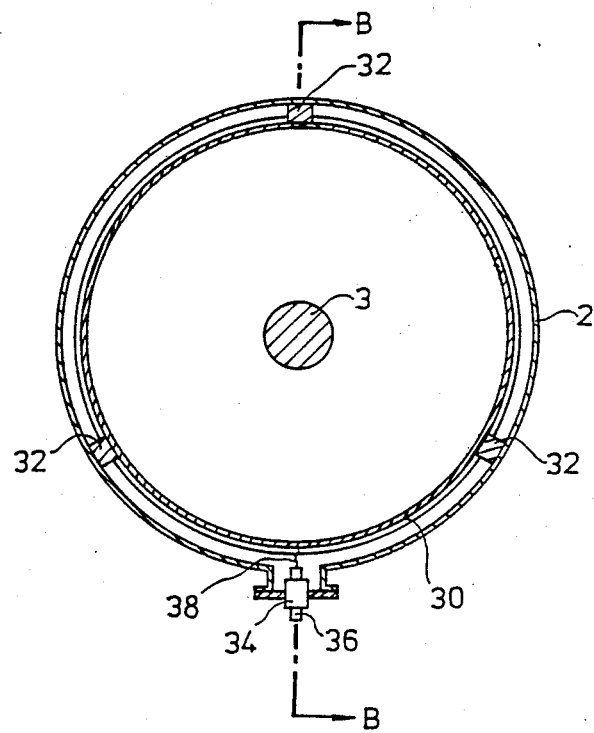
FIG. 3(a) is a cross-sectional front view of another embodiment wherein electrodes are formed in a ring-shape.
Figure 3B:
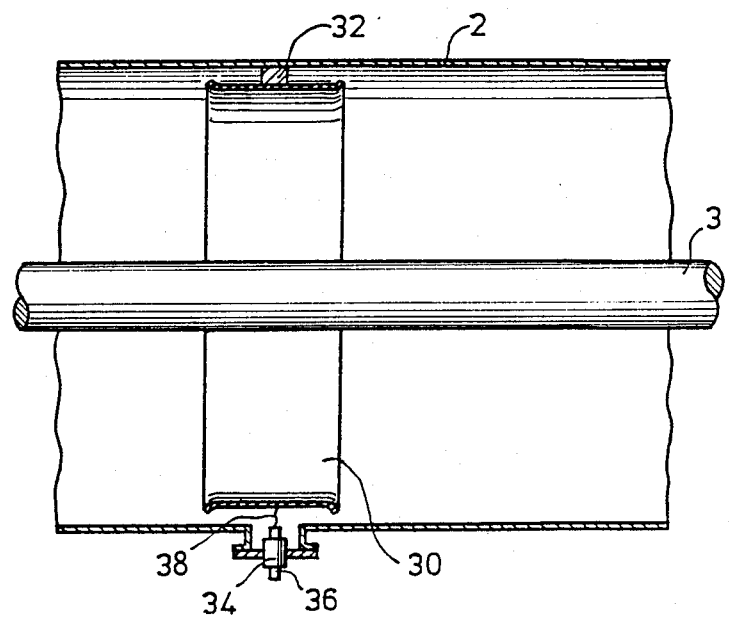
FIG. 3(b) is a cross-sectional side view taken on a cross section B—B shown in FIG. 3(a).
Figure 4:
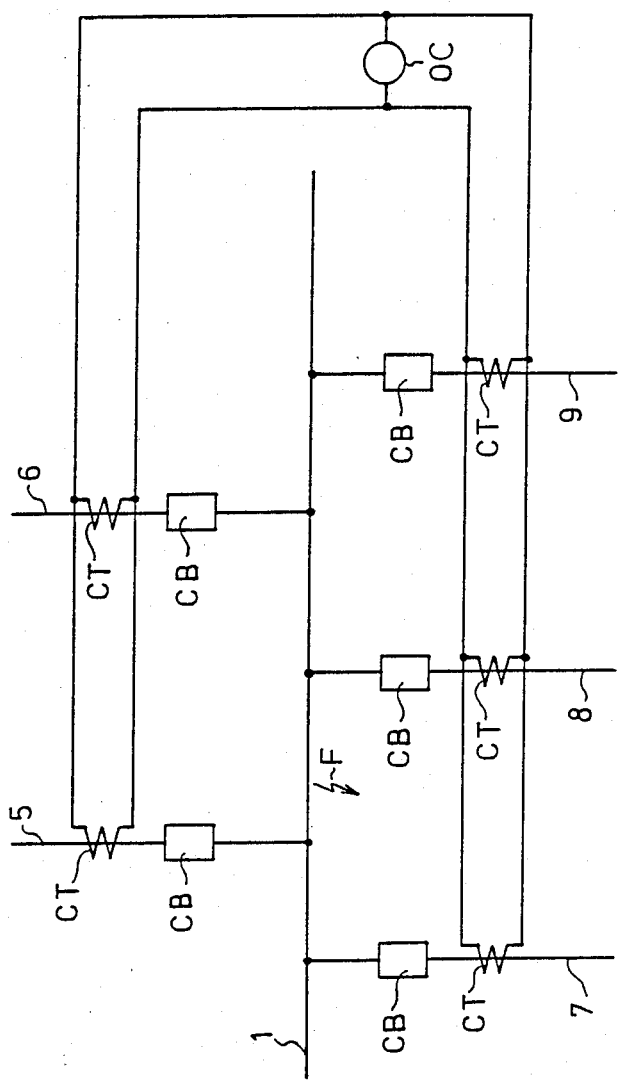
FIG. 4 is the schematic diagram of the typical conventional fault detecting system.
Figure 5:
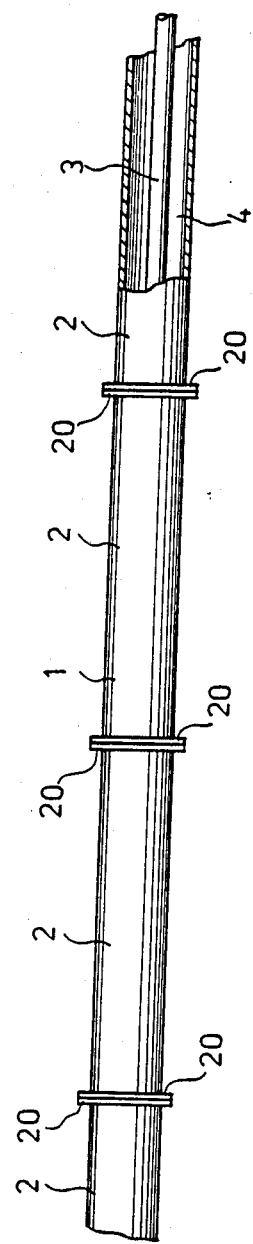
FIG. 5 is the partially diagrammatic sectional view of the typical conventional gas insulated bus.

In another embodiment of the invention, the electrode 30 may be formed in a ring-shape as shown in FIG. 3(a), which is a cross-sectional front view and FIG. 3(b) which is a cross-sectional side view taken on a cross-section B—B of FIG. 3(a). The electrode 30 is provided around the conductor 3 and is supported to the tubular-shaped housing 2 by supporting members 32.

As mentioned above, the apparatus for detecting the position of the fault in accordance with the present invention can detect the position of the fault automatically and substantially simultaneously with occurrence of the trouble. Therefore, a restoration of the fault can be quickly accomplished, because the restoration work does not necessitate the process of identifying the point of the fault.

Further, by utilizing the apparatus, the fault can be preliminarily prevented through detections of the corona discharge.

These two features are great technical advantages over the conventional apparatus wherein the automatic and electrical detection of the fault position without demounting the tubular-shaped housing and, the detection of a potential future internal fault is not been available.

What is claimed is:

1. An apparatus for detecting the position of an internal fault of a gas insulated bus, comprising:
    electrodes provided in a tubular-shaped housing of said gas insulated bus, said electrodes positioned at arbitrary intervals from neighboring electrodes along the axial direction of said tubular-shaped housing, said electrodes for detecting a voltage induced within said housing by flashovers and corona discharge within said housing, wherein said electrodes are disc shaped and are mounted in respective cylindrical, gas-tight enclosures extending radially outward from said tubular-shaped housing, sensing surfaces of said electrodes being flush with, but electrically insulated from, an inner surface of said tubular housing;
    voltage measurement means which measure said electrode voltages thereat; and
    a processing unit responsive to outputs of said measuring means for identifying the position of the fault by comparing outputs from said voltage measurement means.

2. An apparatus for detecting the position of an internal fault of a gas insulated bus, comprising:
    an elongated tubular housing including a plurality of circular apertures space longitudinally along said housing;
    an elongated conductor located within said housing;
    insulating spacers spaced longitudinally along said housing and located between said apertures;
    voltage measurement electrodes spaced longitudinally along said housing and extending through said apertures in said housing and insulated from said housing for detecting a voltage induced within said housing by flashovers and corona discharges; and
    gas tight cylindrical housings extending radially outward from said tubular housing and having an open end extending into each of said apertures and having a closed end including a voltage terminal extending therethrough, each of said voltage measurement electrodes positioned within a corresponding one of said gas tight cylindrical housings and having a sensing surface flush mounted with, but electrically insulated from, an inner surface of said housing, said voltage measurement electrode being electrically connected to said terminal for sampling a voltage of said terminal.

* * * * *